US012680169B2

(12) United States Patent
Iwashita

(10) Patent No.: US 12,680,169 B2
(45) Date of Patent: Jul. 14, 2026

(54) SUBSTRATE LIQUID PROCESSING METHOD AND SUBSTRATE LIQUID PROCESSING APPARATUS

(71) Applicant: Tokyo Electron Limited, Tokyo (JP)

(72) Inventor: Mitsuaki Iwashita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 901 days.

(21) Appl. No.: 17/904,322

(22) PCT Filed: Feb. 8, 2021

(86) PCT No.: PCT/JP2021/004525
§ 371 (c)(1),
(2) Date: Aug. 16, 2022

(87) PCT Pub. No.: WO2021/166709
PCT Pub. Date: Aug. 26, 2021

(65) Prior Publication Data
US 2023/0055960 A1 Feb. 23, 2023

(30) Foreign Application Priority Data
Feb. 20, 2020 (JP) ................................. 2020-027431

(51) Int. Cl.
*C23C 18/18* (2006.01)
*H10W 20/00* (2026.01)

(52) U.S. Cl.
CPC ........... *C23C 18/18* (2013.01); *H10W 20/023* (2026.01); *H10W 20/057* (2026.01); *H10W 20/075* (2026.01); *H10W 20/076* (2026.01)

(58) Field of Classification Search
CPC . C23C 18/38; C23C 18/1628; C23C 18/1632; C23C 18/1893; C23C 18/18;
(Continued)

(56) References Cited

U.S. PATENT DOCUMENTS

2015/0140209 A1* 5/2015 Tanaka ................ C23C 18/1893
427/230
2016/0118296 A1 4/2016 Kolics et al.
2018/0323101 A1 11/2018 Caro et al.

FOREIGN PATENT DOCUMENTS

JP 09-54421 * 2/1997
JP 2006-210508 A 8/2006
(Continued)

OTHER PUBLICATIONS

International Search Report for PCT/JP2021/004525 dated Mar. 30, 2021.

*Primary Examiner* — Katherine A Bareford
(74) *Attorney, Agent, or Firm* — Chrisman Gallo Tochtrop LLC

(57) ABSTRACT

A technique of improving an adhesion between a metal precipitated in a recess of a substrate and a surface partitioning the recess in an electroless plating processing in which a plated metal is deposited from the bottom of the recess is provided. A substrate liquid processing method includes preparing a substrate including a recess and a wiring exposed at a bottom of the recess; forming a self-assembled monolayer on a side wall of the recess; attaching an intermolecular binder, which is allowed to be bonded to both a metal and the self-assembled monolayer, to the self-assembled monolayer; and burying, by supplying an electroless plating solution to the recess in a state where the intermolecular binder is attached to the self-assembled monolayer to precipitate the metal in the recess, the metal in the recess while bringing the metal into close contact with the intermolecular binder.

6 Claims, 10 Drawing Sheets

(58) Field of Classification Search
       CPC ......... H01L 21/76879; H01L 21/76898; H01L
                21/76831; H01L 21/76832; H01L 21/288;
                   H10W 20/076; H10W 20/023; H10W
                     20/057; H10W 20/075; H10P 14/46
       See application file for complete search history.

(56)                      References Cited

FOREIGN PATENT DOCUMENTS

| JP | 2007-177152 | * | 7/2007 | |
| JP | 2007-177152 | A | 7/2007 | |
| JP | 2015-101738 | A | 6/2015 | |
| JP | 2015-161020 | A | 9/2015 | |
| WO | WO-2018147205 | A1 * | 8/2018 | ............. C23C 18/18 |
| WO | 2018/180869 | A1 | 10/2018 | |

* cited by examiner

SUBSTRATE LIQUID PROCESSING METHOD AND SUBSTRATE LIQUID PROCESSING APPARATUS

CROSS-REFERENCE TO RELATED APPLICATIONS

This Application is a U.S. national phase application under 35 U.S.C. § 371 of PCT Application No. PCT/JP2021/004525 filed on Feb. 8, 2021, which claims the benefit of Japanese Patent Application No. 2020-027431 filed on Feb. 20, 2020, the entire disclosures of which are incorporated herein by reference.

TECHNICAL FIELD

The various aspects and embodiments described herein pertain generally to a substrate liquid processing method and a substrate liquid processing device.

BACKGROUND

With the progress of high density wiring in integrated circuits such as LSI, various wiring forming methods such as dual damascene have been proposed. For example, Patent Document 1 discloses a method of manufacturing a semiconductor device, including forming a cap layer on a metal wiring, forming a barrier metal layer on inner walls of a connection hole reaching the metal wiring and a wiring groove connected to the connection hole, and burying a metal layer in the connection hole and the wiring groove.

In such a wiring forming method, various methods have been proposed as a method of burying a metal wiring in a recess (including a hole and a groove). For example, in the manufacturing method of Patent Document 1, by forming a seed layer through physical vapor deposition (PVD) and then depositing plated copper thereon, the copper is buried in the connection hole and the wiring groove. Also, by performing an electroless plating processing with the metal wiring exposed at the bottom of the recess to gradually deposit the plated metal upwards from the bottom side of the recess, the metal may also be buried in the recess.

Patent Document 1: Japanese Patent Laid-open Publication No. 2006-210508

SUMMARY

In one exemplary embodiment, a substrate liquid processing method includes preparing a substrate including a recess and a wiring exposed at a bottom of the recess; forming a self-assembled monolayer on a side wall of the recess; attaching an intermolecular binder, which is allowed to be bonded to both a metal and the self-assembled monolayer, to the self-assembled monolayer; and burying, by supplying an electroless plating solution to the recess in a state where the intermolecular binder is attached to the self-assembled monolayer to precipitate the metal in the recess, the metal in the recess while bringing the metal into close contact with the intermolecular binder.

DETAILED DESCRIPTION

Figure 1:
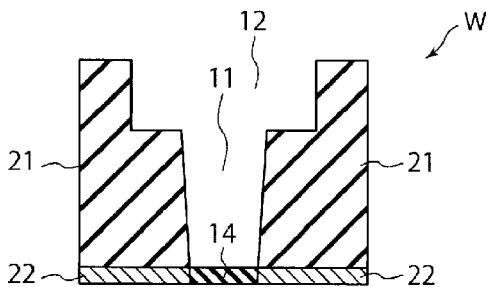
FIG. 1 is a diagram illustrating a partial cross section of a substrate, and shows an example of a process flow of a substrate liquid processing method.

Hereinafter, a substrate liquid processing apparatus and a substrate liquid processing method will be described with reference to the accompanying drawings.

In the following description, an electroless plating processing apparatus and an electroless plating processing method of burying a metal (particularly, copper) that functions as a via (a through-wiring) in a via hole (i.e., a recess) by an electroless plating processing will be described. However, the substrate liquid processing apparatus and the substrate liquid processing method according to the present disclosure are not limited to the following apparatus and method. For example, even when a metal is buried in a recess (including a hole and a groove) other than the via hole, the substrate liquid processing apparatus and the substrate liquid processing method according to the present disclosure can be applied. Further, even when a metal other than copper (e.g., cobalt (Co), gold (Au) or silver (Ag)) is buried in the recess, the substrate liquid processing apparatus and the substrate liquid processing method according to the present disclosure can be applied.

[Substrate Liquid Processing Method]

FIG. 1 to FIG. 5 are diagrams illustrating a partial cross section (particularly, a part including a via hole 11) of a substrate W, and show an example of a process flow of a substrate liquid processing method.

The substrate W includes a via hole 11 and a trench 12 formed in an insulating film 21, and a cap layer (wiring) 14 exposed at a bottom of the via hole 11. In the illustrated substrate W, the insulating film 21 is provided on an etch-stop layer 22, and the etch-stop layer 22 does not exist at a portion corresponding to the cap layer 14. Although not illustrated in the drawing, an insulating film is provided under the etch-stop layer 22, and a metal wiring is provided under the cap layer 14.

Specific materials forming the substrate W and a method of forming the substrate W are not limited. Typically, the insulating film 21 can be formed of a low dielectric constant insulating material film (so-called low-k film) and silicon dioxide ($SiO_2$). Particularly, in the present exemplary embodiment, the insulating film 21 is desirably formed of a material having excellent bonding properties with respect to a self-assembled monolayer (SAM) that functions as a diffusion barrier layer to be described later. For example, the insulating film 21 may be formed of a silicon-containing material.

The etch-stop layer 22 may be formed of silicon carbon nitride (SiCN) or other silicon-based materials (e.g., silicon nitride (SiN) or silicon carbide (SiC)). The cap layer 14 is formed of a material that serves as a catalytic nucleus for a plating reaction in an electroless plating processing of burying a metal (a via wiring 24) in the via hole 11. In the present example, copper is buried as a plated metal in the via hole 11. Thus, the cap layer 14 may be formed of, for example, cobalt (Co) or copper (Cu).

In the substrate liquid processing method of the present exemplary embodiment, the substrate W having the above-described configuration is prepared (see FIG. 1).

Figure 2:
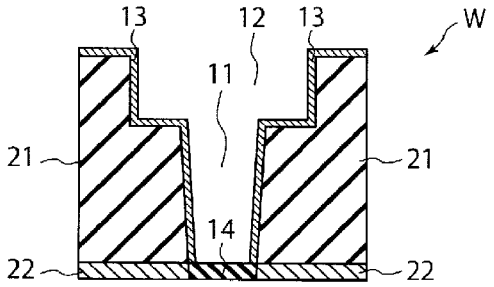
FIG. 2 is a diagram illustrating the partial cross section of the substrate, and shows an example of the process flow of the substrate liquid processing method.

Then, the SAM (self-assembled monolayer) 13 serving as the diffusion barrier layer is formed on a side wall of the via hole 11 of the substrate W (i.e., the insulating film 21 partitioning the via hole 11) (see FIG. 2). The diffusion barrier layer is configured to suppress diffusion of the wiring metal buried in the recess of the substrate W into the insulating film 21. In the illustrated example, the SAM 13 is integrally formed on an exposed surface of the insulating film 21 (i.e., on the side wall of the via hole 11, on a partition surface of the trench 12, and on an upper surface of the insulating film 21).

The SAM 13 is a monolayer formed by self-assembly. A specific method of forming the SAM 13 on the side wall of the via hole 11 is not limited. The SAM 13 may be formed based on any method using a solution or vapor depending on a composition of the SAM 13. Typically, the SAM 13 may be formed on the side walls of the via hole 11 and the trench 12 by exposing the side walls of the via hole 11 and the trench 12 to a solution containing organic molecules and allowing the organic molecules to be chemically adsorbed onto the side walls of the via hole 11 and the trench 12.

The SAM 13 can be formed very thin on the side wall of the recess. For example, the SAM 13 can be formed to a thickness of 2 nm or less (e.g., 1 nm or less) on the side wall of the recess.

The diffusion barrier layer formed of the SAM 13, which is the organic film, has a smaller thickness than a diffusion barrier layer formed of a metal (e.g., TaN (tantalum nitride)), but can equivalently function as the diffusion barrier. In general, if high density wiring is provided on the substrate W, it is desirable that the diffusion barrier layer formed on the side wall of the recess is thin. Therefore, the substrate liquid processing apparatus and the substrate liquid processing method of the present exemplary embodiment in which the SAM 13 serves as the diffusion barrier layer can be desirably applied to the apparatus and method of providing the high density wiring on the substrate W.

A specific composition of the SAM 13 is basically not limited. However, since the SAM 13 is provided as the diffusion barrier layer, it is formed of an organic film that can effectively suppress the diffusion of the metal buried in the via hole 11 and the trench 12 into the insulating film 21. Further, the SAM 13 is formed of a material having excellent bonding properties with respect to both the insulating film 21 and an intermolecular binder 15 to be described later. Furthermore, the SAM 13 is desirably formed of a material that does not precipitate or hardly precipitates a metal even when an electroless plating solution 20 comes into contact with it. The SAM 13 may contain, for example, an organic compound having a silanol group. Specific examples of the composition of the SAM 13 will be described later.

Since the cap layer 14 needs to be exposed to the via hole 11 for the electroless plating processing, the cap layer 14 is basically not coated by the SAM 13. Therefore, it is desirable that the SAM 13 has a composition that is not chemically bonded to the cap layer 14 or a composition that is hardly chemically bonded to the cap layer 14. If the SAM 13 is bonded to or deposited on the cap layer 14 when the SAM 13 is formed on the side wall of the via hole 11, a processing of removing the SAM 13 from the cap layer 14 is performed.

Figure 3:
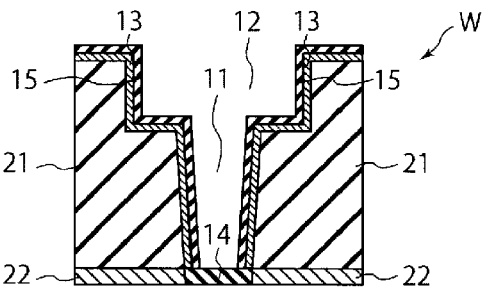
FIG. 3 is a diagram illustrating the partial cross section of the substrate, and shows an example of the process flow of the substrate liquid processing method.
Figure 4:
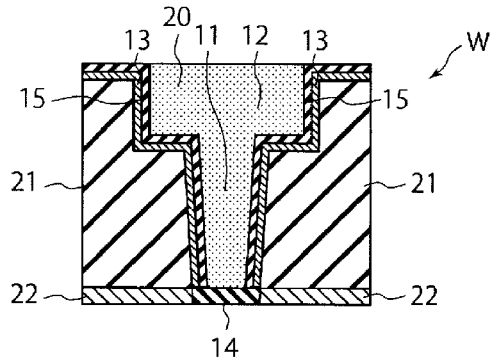
FIG. 4 is a diagram illustrating the partial cross section of the substrate, and shows an example of the process flow of the substrate liquid processing method.

Then, the intermolecular binder 15 that can be bonded to both the metal buried in the via hole 11 and the trench 12 and the SAM 13 is attached to the SAM 13 (see FIG. 3). In the illustrated example, a layer of the intermolecular binder 15 is integrally formed on an exposed surface of the SAM 13 (i.e., on the side wall of the via hole 11, on the partition surface of the trench 12, and on the SAM 13 on the insulating film 21).

A method of attaching the intermolecular binder 15 to the SAM 13 is not limited. The intermolecular binder 15 may be attached to the SAM 13 based on any method using a solution or vapor depending on a composition of the intermolecular binder 15. In terms of reliably attaching the intermolecular binder 15 to the entire SAM 13, it is desirable to use a solution of the intermolecular binder 15. Meanwhile, in terms of reducing the consumption of the intermolecular binder 15, it is desirable to use a vapor of the intermolecular binder 15.

The intermolecular binder 15 serves as a binder configured to increase the degree of fixing between the metal buried in the via hole 11 and the trench 12 and the SAM 13. The intermolecular binder 15 of the present exemplary embodiment is chemically bonded directly to both the metal buried in the via hole 11 and the trench 12 and the SAM 13. Therefore, any element such as a catalyst metal is not interposed between the metal buried in the via hole 11 and the intermolecular binder 15, and any element is not interposed between the intermolecular binder 15 and the SAM 13.

A specific composition of the intermolecular binder 15 is basically not limited. However, since the intermolecular binder 15 of the present exemplary embodiment is provided as the binder between the metal and the SAM 13, it has a composition that can be bonded to both the metal and the SAM 13. Particularly, since the intermolecular binder 15 has a functional group configured to be bonded to the metal and a functional group configured to be bonded to the SAM 13 in order to be bonded to both the metal and the SAM 13 at a molecular level. For example, the intermolecular binder 15 may contain an organic compound having at least one of an amino group and a thiol group. Further, the intermolecular binder 15 is formed of a material that does not precipitate or hardly precipitates the metal even when the electroless plating solution 20 comes into contact with it. Specific examples of the composition of the intermolecular binder 15 will be described later (see FIG. 10).

Since the cap layer 14 needs to be exposed to the via hole 11 for the electroless plating processing, the cap layer 14 is basically not coated by the intermolecular binder 15. Therefore, it is desirable that the intermolecular binder 15 has a composition that is not chemically bonded to the cap layer 14 or a composition that is hardly chemically bonded to the cap layer 14. If the intermolecular binder 15 is bonded to or deposited on the cap layer 14 when the layer of the intermolecular binder 15 is formed on the SAM 13, a processing of removing the intermolecular binder 15 from the cap layer 14 is performed.

Figure 5:
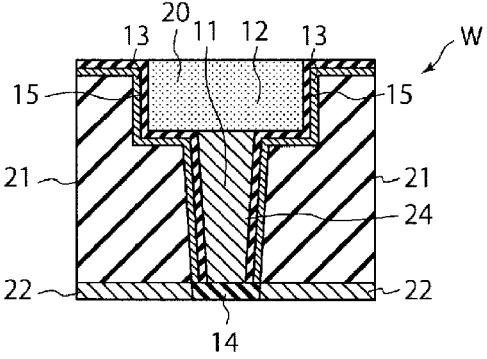
FIG. 5 is a diagram illustrating the partial cross section of the substrate, and shows an example of the process flow of the substrate liquid processing method.

Then, the electroless plating solution 20 is supplied to the via hole 11 in a state where the intermolecular binder 15 is attached to the SAM 13 (see FIG. 4), and the metal (copper in this example) forming the via wiring 24 is precipitated in the via hole 11 (see FIG. 5). That is, the cap layer 14 exposed at the bottom of the via hole 11 serves as a catalyst nucleus, and the metal precipitated by the electroless plating processing is selectively deposited on the cap layer 14. Meanwhile, the intermolecular binder 15 surrounding the electroless plating solution 20 in the via hole 11 does not precipitate or hardly precipitates the metal even when the electroless plating solution 20 comes into contact with it. For this reason, in a processing of collecting the electroless plating solution 20 in the via hole 11 and precipitating the metal in the via hole 11, the metal is grown from the bottom of the via hole 11, but the metal is not grown from the side of the via hole 11. Therefore, in the via hole 11, the metal is gradually deposited upwards from the bottom, so that the via wiring 24 is formed.

In general, the electroless plating processing of depositing the metal from the bottom in the via hole 11 has an advantage that the plated metal can be selectively deposited in the via hole 11 while effectively suppressing the generation of voids (cavities). Meanwhile, if a partition surface (particularly, a side surface) of the via hole 11 is not chemically bonded to the plated metal in the via hole 11, the plated metal is merely in contact with the partition surface of the via hole 11, and the adhesion and the fixing properties between the partition surface of the via hole 11 and the plated metal is not necessarily good. Therefore, in an environment accompanied by a temperature change, problems such as stress migration may occur due to a deviation of the plated metal from the partition surface of the via hole 11, and in some cases, the metal wiring may be cut (disconnected).

Meanwhile, according to the present exemplary embodiment, the electroless plating solution 20 is supplied to the via hole 11 in the state where the intermolecular binder 15 is attached to the SAM 13 to precipitate the metal in the via hole 11, and the metal is buried in the via hole 11 while being brought into close contact with the intermolecular binder 15. Since the adhesion and the fixing properties between the metal in the via hole 11 and the SAM 13 are enhanced by the intermolecular binder 15, the metal in the via hole 11 is firmly fixed to the SAM 13 via the intermolecular binder 15. Therefore, for example, even in the environment accompanied by the great temperature change, the metal in the via hole 11 is less likely to have the deviation from the SAM 13. As a result, the stress migration can be suppressed, and, thus, the occurrence of problems such as disconnection can be effectively suppressed.

Further, when a material of the SAM 13 is selected, the bonding properties of the SAM 13 with respect to the intermolecular binder 15 need to be considered. However, the bonding properties of the SAM 13 with respect to the plated metal do not need to be considered. When the material of the SAM 13 is selected in consideration of the bonding properties of the SAM 13 with respect to the plated metal, materials that can be used for the SAM 13 are limited. Meanwhile, according to the present exemplary embodiment, since the fixing properties between the metal buried in the via hole 11 and the SAM 13 are secured by the intermolecular binder 15, the material of the SAM 13 can be selected from a wide range of candidate materials having excellent diffusion barrier properties.

Any processing that has not been described above may be performed before, during or after the above-described substrate liquid processing method. For example, after the metal of the via wiring 24 (see FIG. 5) is buried in the via hole 11, the metal wiring is also buried in the trench 12 by the electroless plating processing or other processings. Further, the substrate W (particularly, a process surface) may be subjected to a cleaning processing, a rinse processing and/or a drying processing before and after the above-described substrate liquid processing method.

By performing a heating processing before and after each processing of the substrate liquid processing method and/or during each processing, the fixing properties of the SAM 13, the intermolecular binder 15, and/or the plated metal can be enhanced. Hereinafter, a typical example of the heating processing will be described.

[Example of Heating Processing]

Figure 6:
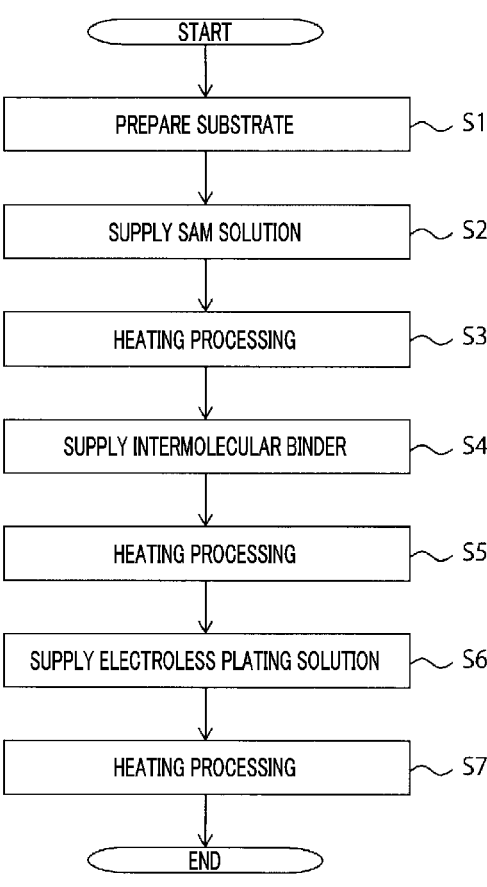
FIG. 6 is a flowchart showing an example of the substrate liquid processing method including a heating processing.

FIG. 6 is a flowchart showing an example of the substrate liquid processing method including a heating processing.

As described above, in order to bury the metal in the via hole 11, the preparation of the substrate W (S1 in FIG. 6), the supply of the solution of the SAM 13 (S2), the supply of the intermolecular binder 15 (S4) and the supply of the electroless plating solution 20 (S6) are performed sequentially. The substrate W may be subjected to a heating processing before and after these processings to heat the substrate W to a temperature higher than the environmental temperature (typically, normal temperature of from 5° C. to 35° C.).

For example, the substrate W may be subjected to a heating processing (S3) between the supply of the solution of the SAM 13 (S2) and the supply of the intermolecular binder 15 (S4). By heating the SAM 13 on the side wall of the via hole 11 before attaching the intermolecular binder 15 to the SAM 13, the reactivity of the SAM 13 to the intermolecular binder 15 and the fixing properties of the SAM 13 with respect to the side wall of the via hole 11 (the insulating film 21) can be enhanced.

Further, the substrate W may be subjected to a heating processing (S5) between the application of the intermolecular binder 15 (S4) and the supply of the electroless plating solution 20 (S6). By heating the intermolecular binder 15 attached to the SAM 13 before supplying the electroless plating solution 20 into the via hole 11, the reactivity of the intermolecular binder 15 to the metal and the fixing properties of the intermolecular binder 15 with respect to the SAM 13 can be enhanced.

Furthermore, the substrate W may be subjected to a heating processing (S7) after the supply of the electroless plating solution 20 (S6) (particularly, after the plated metal is precipitated). In this case, the fixing properties among the insulating film 21, the SAM 13, the intermolecular binder 15 and the plated metal can be enhanced.

Each of the above-described heating processings (S3, S5 and S7) is not necessarily performed. For example, only a heating processing that can be expected to have a great effect may be performed.

Specific heating temperatures in the above-described heating processings (S3, S5 and S7) are appropriately determined depending on the purpose of each processing. For example, a heating processing for the purpose of increasing the fixing properties between the structures (the SAM 13, the intermolecular binder 15 and/or the plated metal) of the substrate W and a heating processing for the purpose of increasing the reactivity of the structures of the substrate W are typically different from each other in the optimum heating temperature. Further, each of the above-described heating processings (S3, S5 and S7) may include a plurality of heating processes. In the plurality of heating processes, the substrate W may be heated at the same temperature or at different temperatures. Any processing that has not been described above may be further performed.

Hereinafter, a specific example of the heating processing will be described.

Figure 7:
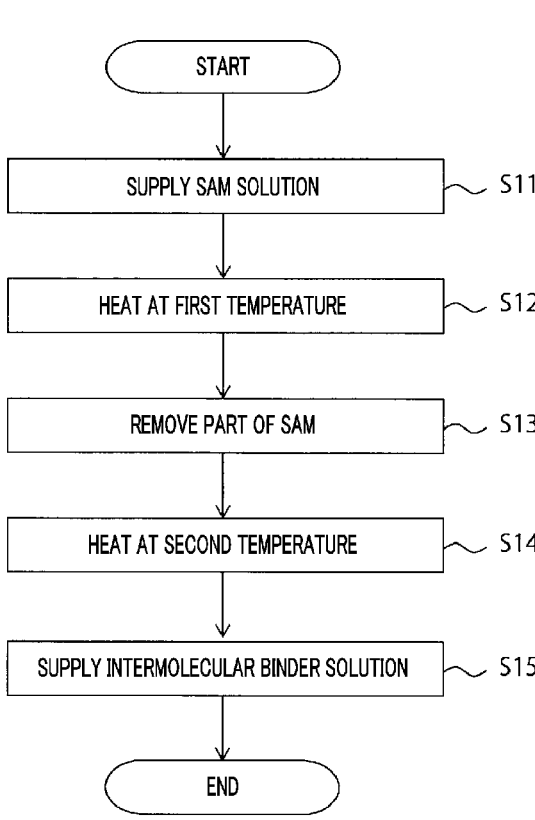
FIG. 7 is a flowchart showing an example of the heating processing (see S3 in FIG. 6) performed between a processing of supplying a solution of a SAM and a processing of supplying a solution of an intermolecular binder.

FIG. 7 is a flowchart showing an example of the heating processing (see S3 in FIG. 6) performed between the processing of supplying the solution of the SAM 13 and the process of supplying the solution of the intermolecular binder 15.

In the example shown in FIG. 7, after the solution containing the components of the SAM 13 is supplied to the side wall of the via hole 11 (S11 in FIG. 7), the substrate W is heated at a first temperature (S12). By heating the SAM 13 on the side wall of the via hole 11 at the first temperature before attaching the intermolecular binder 15 to the SAM 13, the bonding between the side wall of the via hole 11 and the SAM 13 can be enhanced. However, in the present heating processing, a curing reaction such as cross-linking is not completed in the entire SAM 13.

Therefore, the "first temperature" is effective in promoting the enhancement of the bonding between the side wall of the via hole 11 and the SAM 13, but effective in suppressing the completion of the curing reaction such as cross-linking in the entire SAM 13. The "first temperature" may vary depending on the actual composition of the SAM 13 and the actual heating time. In the present example, the "first temperature" is lower than a "second temperature" (see S14) to be described later. For example, it is lower than 100° C.

Then, a part of the SAM 13 is removed from the side wall of the via hole 11 (S13). That is, after the SAM 13 is heated at the first temperature and before the intermolecular binder 15 is attached to the SAM 13, a part of the SAM 13 is removed from the side wall of the via hole 11. Accordingly, the SAM 13 formed on the side wall of the via hole 11 can be thin by removing the excessive SAM 13 from the substrate W.

A method of removing the SAM 13 from the side wall of the via hole 11 is not limited. For example, an organic solution may be supplied to the SAM 13 on the side wall of the via hole 11 and a part of the SAM 13 having a low degree of fixing to the insulating film 21 (including the solution of the SAM 13) may be washed away with the organic solution.

Thereafter, the substrate W is heated at the second temperature (S14). By heating the SAM 13 on the side wall of the via hole 11 after removing the part of the SAM 13 from the side wall of the via hole 11 and before attaching the intermolecular binder 15 to the SAM 13, the reactivity of the SAM 13 to the intermolecular binder 15 can be increased. However, in the present heating process, a curing reaction such as cross-linking is not completed in the entire SAM 13.

Therefore, the "second temperature" is effective in increasing the reactivity of the SAM 13 to the intermolecular binder 15, but effective in suppressing the completion of the curing reaction such as cross-linking in the entire SAM 13. For example, a temperature at which a cutoff (i.e., cleavage) of a covalent bond in constituent molecules of the SAM 13 (particularly, a functional group that reacts with the intermolecular binder 15) can be urged may be set as the "second temperature". The "second temperature" may vary depending on the actual composition of the SAM 13 and the actual heating time. In the present example, the "second temperature" is higher than the "first temperature" (see S12). For example, it is higher than 100° C. and lower than 250° C.

Then, the solution of the intermolecular binder 15 is supplied onto the SAM 13 that partitions the via hole 11 (S15). As a result, the intermolecular binder 15 is attached to the SAM 13 whose reactivity has been increased, and, thus, the intermolecular binder 15 can be firmly bonded to the SAM 13.

As described above, according to the example of the heating processing shown in FIG. 7, the SAM 13 can be firmly bonded to the insulating film 21, and the intermolecular binder 15 can also be firmly bonded to the SAM 13. Further, the thickness of the SAM 13 in the form of the thin film is adjusted with high precision by performing the processing (S13) of removing the part of the SAM 13 between the heating processing at the first temperature (S12) and the heating processing at the second temperature (S14).

Figure 8:
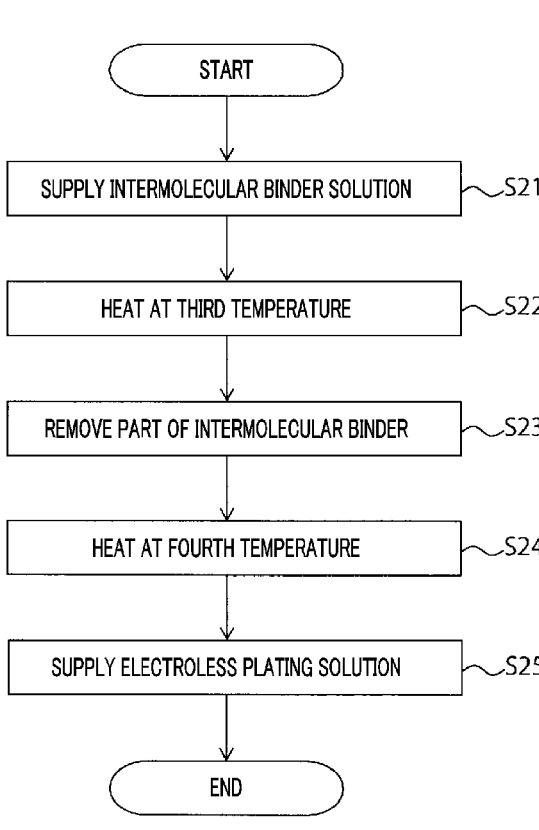
FIG. 8 is a flowchart showing an example of the heating processing (see S5 in FIG. 6) performed between the processing of supplying the solution of the intermolecular binder and a processing of supplying an electroless plating solution.

FIG. 8 is a flowchart showing an example of the heating processing (see S5 in FIG. 6) performed between the processing of supplying the solution of the intermolecular binder 15 and the processing of supplying the electroless plating solution 20.

In the example shown in FIG. 8, after the solution containing the components of the intermolecular binder 15 is supplied onto the SAM 13 (S21 in FIG. 8), the substrate W is heated at a third temperature (S22). By heating the intermolecular binder 15 attached to the SAM 13 at the third temperature before supplying the electroless plating solution 20 into the via hole 11, the bonding between the intermolecular binder 15 and the SAM 13 can be enhanced. However, in the present heating processing, a curing reaction such as cross-linking is not completed in the entire intermolecular binder 15.

Therefore, the "third temperature" is effective in promoting the enhancement of the bonding between the SAM 13 and the intermolecular binder 15, but effective in suppressing the completion of the curing reaction such as cross-linking in the entire intermolecular binder 15. The "third temperature" may vary depending on the actual composition of the intermolecular binder 15 and the actual heating time. In the present example, the "third temperature" is lower than a "fourth temperature" (see S24) to be described later. For example, it is lower than 100° C.

Then, a part of the intermolecular binder 15 is removed from the SAM 13 (S23). That is, after the intermolecular binder 15 is heated at the third temperature and before the electroless plating solution 20 is supplied into the via hole 11, a part of the intermolecular binder 15 is removed from the SAM 13. Accordingly, the intermolecular binder 15 formed on the SAM 13 can be thin by removing the excessive intermolecular binder 15 from the substrate W.

A method of removing the intermolecular binder 15 from the SAM 13 is not limited. For example, an organic solution may be supplied to the intermolecular binder 15 on the SAM 13 and a part of the intermolecular binder 15 having a low degree of fixing to the SAM 13 (including the solution of the intermolecular binder 15) may be washed away with the organic solution.

Thereafter, the substrate W is heated at the fourth temperature (S24). By heating the intermolecular binder 15 on the SAM 13 after removing the part of the intermolecular binder 15 from the SAM 13 and before supplying the electroless plating solution 20 into the via hole 11, the bonding of the intermolecular binder 15 to the SAM 13 can be enhanced. Also, the reactivity of the intermolecular binder 15 to the metal buried in the via hole 11 may be increased by the present heating processing. However, in the present heating processing, the reactivity of the intermolecular binder 15 to the plated metal is not greatly degraded.

Therefore, the "fourth temperature" is effective in increasing the reactivity of the intermolecular binder 15 to the SAM 13, but effective in suppressing the great degradation of the reactivity of the intermolecular binder 15 to the plated metal. The "fourth temperature" may vary depending on the actual composition of the intermolecular binder 15 and the actual heating time. In the present example, the "fourth temperature" is higher than the "third temperature" (see S22). For example, it is in the range of from 250° C. to 300° C.

Then, the electroless plating solution 20 is supplied into the via hole 11 (S25). As a result, in the via hole 11, the metal is bonded to the intermolecular binder 15 while the metal is gradually deposited. Therefore, the metal buried in the via hole 11 can be firmly fixed to the SAM 13 via the intermolecular binder 15.

As described above, according to the example of heating processing shown in FIG. 8, the intermolecular binder 15 can be firmly bonded to the SAM 13, and the metal buried in the via hole 11 can also be firmly bonded to the intermolecular binder 15. Further, the thickness of the intermolecular binder 15 in the form of the thin film is adjusted with high precision by performing the processing (S23) of removing the part of the intermolecular binder 15 between the heating processing at the third temperature (S22) and the heating processing at the fourth temperature (S24).

Figure 9:
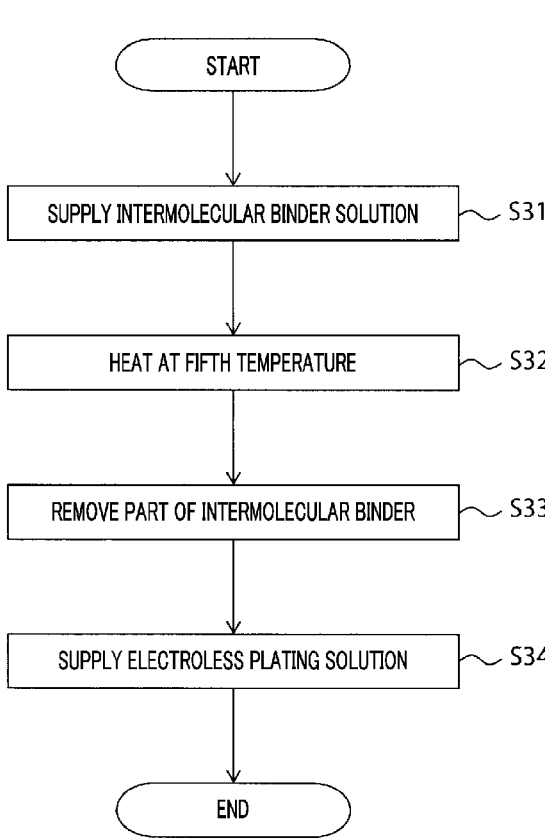
FIG. 9 is a flowchart showing another example of the heating processing (see S5 in FIG. 6) performed between the processing of supplying the solution of the intermolecular binder and the processing of supplying the electroless plating solution.

FIG. 9 is a flowchart showing another example of the heating processing (see S5 in FIG. 6) performed between the processing of supplying the solution of the intermolecular binder 15 and the processing of supplying the electroless plating solution 20.

In the example shown in FIG. 9, after the solution containing the components of the intermolecular binder 15 is supplied onto the SAM 13 (S31 in FIG. 9), the substrate W is heated at a fifth temperature (S32). By heating the intermolecular binder 15 attached to the SAM 13 at the fifth temperature before supplying the electroless plating solution 20 into the via hole 11, the bonding between the intermolecular binder 15 and the SAM 13 can be enhanced. Also, particularly, a part of the intermolecular binder 15 on the SAM 13 with a desired thickness can be firmly fixed to the intermolecular binder 15 by the present heating processing. However, in the present heating processing, the reactivity of the intermolecular binder 15 to the plated metal is not greatly degraded.

Therefore, the "fifth temperature" is effective in promoting the enhancement of the bonding between the SAM 13 and the intermolecular binder 15 and fixing a part of the intermolecular binder 15 remaining on the SAM 13 to the SAM 13. However, the "fifth temperature" is effective in suppressing the great degradation of the reactivity of the intermolecular binder 15 to the plated metal. The "fifth temperature" may vary depending on the actual composition of the intermolecular binder 15 and the actual heating time. In the present example, the "fifth temperature" is higher than the "third temperature" (see S22 in FIG. 8). For example, it is in the range of from 250° C. to 300° C.

Then, a part of the intermolecular binder 15 is removed from the SAM 13 (S33). That is, after the intermolecular binder 15 is heated at the fifth temperature and before the electroless plating solution 20 is supplied into the via hole 11, the part of the intermolecular binder 15 is removed from the SAM 13. Accordingly, the excessive intermolecular binder 15 can be removed from the substrate W. A method of removing the intermolecular binder 15 in the present processing can be performed in the same manner as in the example (particularly, process S23) shown in FIG. 8.

Then, the electroless plating solution 20 is supplied into the via hole 11 (S34). As a result, in the via hole 11, the metal is bonded to the intermolecular binder 15 while the metal is gradually deposited. Therefore, the metal buried in the via hole 11 can be firmly fixed to the SAM 13 via the intermolecular binder 15.

As described above, according to the example of the heating processing shown in FIG. 9, the intermolecular binder 15 can be firmly bonded to the SAM 13, and the metal buried in the via hole 11 can also be firmly bonded to the intermolecular binder 15. Further, the intermolecular binder 15 is subjected to the heating processing (S32) only once, and, thus, the processing flow can be simplified and the total processing time can be shortened as compared to the case where the intermolecular binder 15 is subjected to the plurality of heating processings (see FIG. 8).

The processing flow shown in FIG. 7 may or may not be combined with the processing flow shown in FIG. 8 or the processing flow shown in FIG. 9, and may be combined with another processing flow. Likewise, each of the processing flow shown in FIG. 8 and the processing flow shown in FIG. 9 may be combined with a processing flow different from the processing flow shown in FIG. 7.

[Example of Composition of Self-Assembled Monolayer and Intermolecular Binder]

A specific composition of each of the SAM 13 and the intermolecular binder 15 is basically not limited, but is selected in comprehensive consideration of various required properties. In particular, the composition of the SAM 13 of the present exemplary embodiment is determined in consideration of the function as the diffusion barrier layer, the good bonding properties to the insulating film 21 and the intermolecular binder 15, and the secured exposure of the cap layer 14. Meanwhile, the composition of the intermolecular binder 15 is determined in consideration of the good bonding properties to the SAM 13 and the plated metal, and the secured exposure of the cap layer 14.

For example, a silanol-based organic film may be used as the SAM 13. By using an organic film having a hydroxy group as the SAM 13, the SAM 13 may be dehydration-synthesized to the side wall of the via hole 11 (the insulating film 21) and the intermolecular binder 15. For example, the silanol-based SAM 13 may be formed on the side wall of the via hole 11 formed of a silicon-containing material.

Meanwhile, for example, a compound (e.g., a silane coupling agent) having both a functional group that reacts with and is bonded to an organic material (i.e., the SAM 13) and a functional group that reacts with and is bonded to an inorganic material (i.e., the plated metal) in a molecule may be used as the intermolecular binder 15. Examples of the functional group that reacts with and is bonded to the organic material may include a vinyl group, an epoxy group, an amino group, a methacryl group and a mercapto group. Also, the functional group that reacts with and is bonded to the inorganic material may be a functional group that produces silanol by reaction with water (including moisture), and examples thereof may include an alkoxy group (e.g., a methoxy group and an ethoxy group), an acetoxy group, and a chloro atom. Alternatively, a compound having a ligand (e.g., an amino group or a thiol group) that is coordinate-bonded to a metal may be used as the intermolecular binder 15. Examples of the compound having these functional groups may include triazine.

Figure 10:
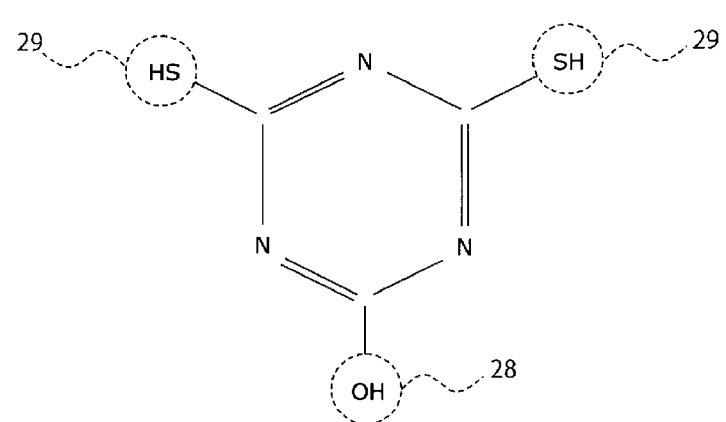
FIG. 10 is a structural formula showing an example of the molecular structure of a triazine that can be used as the intermolecular binder.

FIG. 10 is a structural formula showing an example of the molecular structure of the triazine that can be used as the intermolecular binder 15. A compound forming the intermolecular binder 15 has an organic reactive group 28 (a hydroxy group (—OH) in FIG. 10) that can be bonded to the SAM 13 formed of the organic material. Meanwhile, the compound forming the intermolecular binder 15 has an inorganic reactive group 29 (a thiol group (—SH) in FIG. 10) that can be bonded to the plated metal formed of the inorganic material. If the intermolecular binder 15 contains a compound having a thiol group, the thiol group of the intermolecular binder 15 is self-assembled on the surface of the plated metal (copper in the present example).

[Substrate Liquid Processing Apparatus]

Hereinafter, an example of a substrate liquid processing apparatus configured to perform the above-described substrate liquid processing method will be described.

Figure 11:
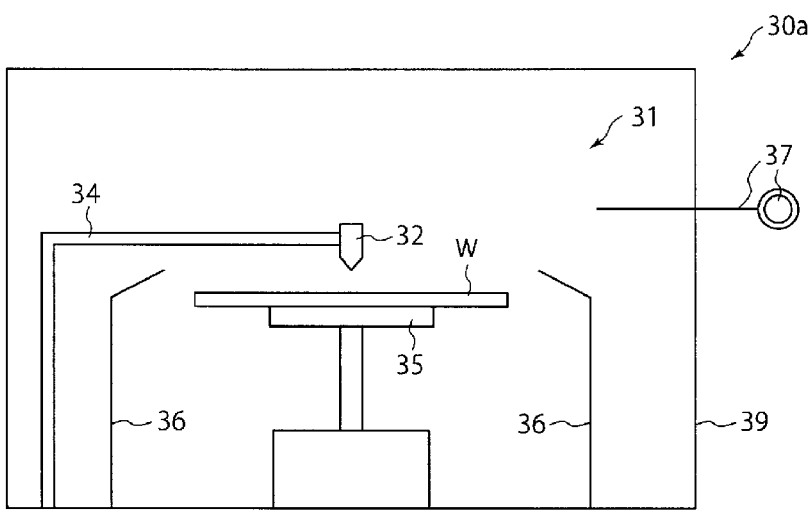
FIG. 11 is a diagram schematically illustrating an example of a SAM processing unit including a SAM solution supply unit.

FIG. 11 is a diagram schematically illustrating an example of a SAM processing unit 30*a* including a SAM solution supply unit 31. A specific configuration of each component of the SAM solution supply unit 31 is not limited. Each component of the SAM solution supply unit 31 is simply illustrated in FIG. 11.

The SAM solution supply unit 31 is configured to supply the organic solution containing the constituent molecules of the SAM 13 to the substrate W to form the SAM 13 on the side walls of the via hole 11 and the trench 12. The illustrated SAM solution supply unit 31 includes a first discharge member 32 configured to be moved by a first discharge driving unit 34, a first substrate holder 35, a first cup structure 36 and a first inert gas supply 37. Particularly, the first discharge member 32, the first discharge driving unit 34, the first substrate holder 35 and the first cup structure 36 are provided inside a first processing chamber 39.

The first substrate holder 35 is configured to hold the substrate W rotatably. The illustrated first substrate holder 35 attracts and holds a rear surface of the substrate W. A specific method of holding the substrate W is not limited. The first discharge member 32 includes at least a nozzle (not shown) configured to discharge the organic solution containing the constituent molecules of the SAM 13. The first discharge member 32 may be configured to discharge another fluid. For example, a cleaning solution for cleaning the substrate W or a rinse solution for rinsing the substrate W may be discharged from the first discharge member 32. When a plurality of kinds of fluids (e.g., a plurality of kinds of liquids) is discharged from the first discharge member 32, the first discharge member 32 may discharge two or more kinds of fluids from a common nozzle or may include two or more nozzles for discharging different kinds of fluids. Further, a fluid (including the organic solution of the SAM 13) discharged from the first discharge member 32 is supplied from a non-illustrated fluid source to the first discharge member 32 through a flow path provided in the first discharge driving unit 34.

The first cup structure 36 having an annular planar shape is provided to surround the substrate W held by the first substrate holder 35. The first cup structure 36 receives a liquid scattered from the substrate W and guides the received liquid into a drain duct (not shown) or rectifies a gas flow to suppress diffusion of a gas around the substrate W. A specific configuration of the first cup structure 36 is not limited. For example, the first cup structure 36 may have a cup for mainly guiding the liquid and a cup for mainly rectifying the gas flow separately.

The first inert gas supply 37 is configured to supply an inert gas (e.g., nitrogen) into the first processing chamber 39. The first processing chamber 39 is basically sealed, and, thus, outside air cannot be introduced into the first processing chamber 39. The first processing chamber 39 does not necessarily require complete airtightness, and just needs to be sealed to effectively suppress the introduction of the outside air into the first processing chamber 39 (particularly, introduction of the outside air to around the substrate W held by the first substrate holder 35).

In the above-described SAM processing unit 30*a*, the organic solution containing the constituent molecules of the SAM 13 is supplied to the substrate W. That is, the substrate W is carried into the first processing chamber 39, and in a state where the substrate W is held by the first substrate holder 35, the organic solution is discharged from the first discharge member 32 toward the processing surface (upper surface) of the substrate W. In this case, the organic solution containing the constituent molecules of the SAM 13 may be supplied to the processing surface of the substrate W while the substrate W is rotated by the first substrate holder 35.

A landing position of the liquid discharged from the first discharge member 32 on the processing surface of the substrate W is not limited. The first discharge member 32 may allow the organic solution to land on the center of the processing surface of the substrate W (i.e., on a central axis of rotation of the substrate W rotated by the first substrate holder 35), or to land at a position deviated from the center of the processing surface of the substrate W.

Figure 12:
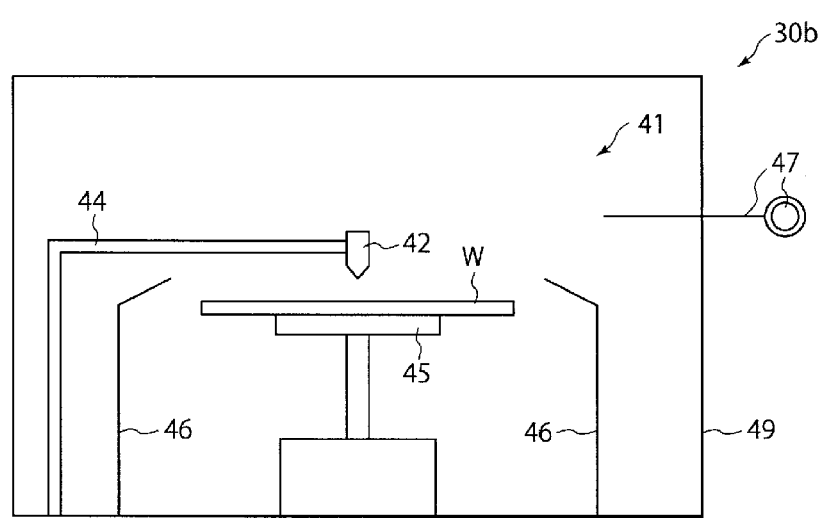
FIG. 12 is a diagram schematically illustrating an example of an intermolecular binder processing unit including an intermolecular binder supply unit.

FIG. 12 is a diagram schematically illustrating an example of an intermolecular binder processing unit 30*b* including an intermolecular binder supply unit 41. A specific configuration of each component of the intermolecular binder supply unit 41 is not limited. Each component of the intermolecular binder supply unit 41 is simply illustrated in FIG. 12.

The intermolecular binder supply unit 41 is configured to supply the solution containing constituent molecules of the intermolecular binder 15 to the substrate W to form the layer of the intermolecular binder 15 on the SAM 13. The illustrated intermolecular binder supply unit 41 includes a second discharge member 42 configured to be moved by a second discharge driving unit 44, a second substrate holder 45, a second cup structure 46 and a second inert gas supply 47. Particularly, the second discharge member 42, the second discharge driving unit 44, the second substrate holder 45 and the second cup structure 46 are provided inside a second processing chamber 49.

The second discharge member 42 includes at least a nozzle (not shown) configured to discharge the solution containing the constituent molecules of the intermolecular binder 15. Like the first discharge member 32, the second discharge member 42 may be configured to discharge another fluid. Further, a fluid (including the solution of the intermolecular binder 15) discharged from the second discharge member 42 is supplied from a non-illustrated fluid source to the second discharge member 42 through a flow path provided in the second discharge driving unit 44. The second substrate holder 45, the second cup structure 46, the second inert gas supply 47 and the second processing chamber 49 have the same configuration and effect as the above-described first substrate holder 35, first cup structure 36, first inert gas supply 37 and first processing chamber 39, respectively.

In the above-described intermolecular binder processing unit 30b, the solution containing the constituent molecules of the intermolecular binder 15 is supplied to the substrate W. That is, the substrate W including the SAM 13 is carried into the second processing chamber 49, and in a state where the substrate W is held by the second substrate holder 45, the solution is discharged from the second discharge member 42 toward the processing surface of the substrate W. In this case, the solution containing the constituent molecules of the intermolecular binder 15 may be supplied to the processing surface of the substrate W while the substrate W is rotated by the second substrate holder 45.

A landing position of the liquid discharged from the second discharge member 42 on the processing surface of the substrate W is not limited. The second discharge member 42 may allow the solution containing the constituent molecules of the intermolecular binder 15 to land on the center of the processing surface of the substrate W or to land at a position deviated from the center of the processing surface of the substrate W.

Figure 13:
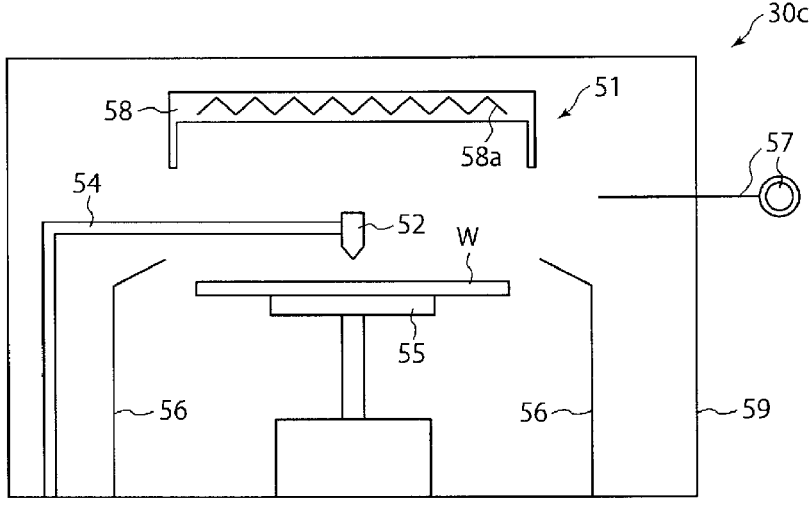
FIG. 13 is a diagram schematically illustrating an example of a plating processing unit including an electroless plating solution supply unit.

FIG. 13 is a diagram schematically illustrating an example of a plating processing unit 30c including an electroless plating solution supply unit 51. A specific configuration of each component of the electroless plating solution supply unit 51 is not limited. Each component of the electroless plating solution supply unit 51 is simply illustrated in FIG. 13.

The electroless plating solution supply unit 51 is configured to supply the electroless plating solution 20 to the via hole 11 of the substrate W to precipitate the metal in the via hole 11. The illustrated electroless plating solution supply unit 51 includes a third discharge member 52 configured to be moved by a third discharge driving unit 54, a third substrate holder 55, a third cup structure 56, a third inert gas supply 57 and a first heating device 58 equipped with a first heater 58a. The third discharge member 52, the third discharge driving unit 54, the third substrate holder 55, the third cup structure 56 and the first heating device 58 are provided inside a third processing chamber 59.

The third discharge member 52 includes at least a nozzle (not shown) configured to discharge the electroless plating solution 20. Like the first discharge member 32, the third discharge member 52 may be configured to discharge another fluid. A fluid (including the electroless plating solution 20) discharged from the third discharge member 52 is supplied from a non-illustrated fluid source to the third discharge member 52 through a flow path provided in the third discharge driving unit 54. The third substrate holder 55, the third cup structure 56, the third inert gas supply 57 and the third processing chamber 59 have the same configuration and effect as the above-described first substrate holder 35, first cup structure 36, first inert gas supply 37 and first processing chamber 39, respectively.

The first heating device 58 can be moved up and down by a non-illustrated driving mechanism. For example, when the substrate W is heated, the first heating device 58 is located at a lower position close to the substrate W. When the substrate W is not heated, the first heating device 58 is located at an upper position away from the substrate W. While the third discharge member 52 is located above the substrate W, the first heating device 58 is located at a height position where it does not contact nor collide with the third discharge member 52 and the third discharge driving unit 54.

In the illustrated example, the first heating device 58 serving as a top plate covering the substrate W held by the third substrate holder 55 from above and the third discharge member 52 configured to supply the electroless plating solution 20 to the substrate W are provided separately. However, the nozzle configured to discharge the electroless plating solution 20 toward the substrate W may also be integrally provided with the top plate. For example, a liquid guide hole (not shown) formed through the first heating device 58 at the center of the first heating device 58 (i.e., at a position facing the center of the substrate W in a height direction) may be used as the nozzle configured to discharge the electroless plating solution 20 toward the substrate W. In this case, although not illustrated in the drawings, a plating solution supply path may be connected to the liquid guide hole via a valve, and the electroless plating solution 20 may be supplied to the substrate W from a bottom opening of the liquid guide hole while the valve is opened.

In the above-described plating processing unit 30c, the electroless plating solution 20 is supplied to the substrate W and the plated metal (copper in the present example) is buried in the via hole 11. That is, the substrate W including the SAM 13 and the intermolecular binder 15 is carried into the third processing chamber 59, and in a state where the substrate W is held by the third substrate holder 55, the electroless plating solution 20 is discharged from the third discharge member 52 toward the processing surface of the substrate W. In this case, the electroless plating solution 20 may be supplied to the processing surface of the substrate W while the substrate W is rotated by the third substrate holder 55.

A landing position of the liquid discharged from the third discharge member 52 on the processing surface of the substrate W is not limited. The third discharge member 52 may allow the electroless plating solution 20 to land on the center of the processing surface of the substrate W or to land at a position deviated from the center of the processing surface of the substrate W.

Then, the entire processing surface of the substrate W is maintained in a state of being supplied with the electroless plating solution 20, and with the elapse of time, the metal is deposited and grows in the via hole 11. As a result, the metal is buried in the via hole 11 to form the via wiring 24 in the via hole 11. In this case, the electroless plating solution 20 on the substrate W may be heated by the first heating device 58 to promote the deposition of the metal. For example, the electroless plating solution 20 on the substrate W can be heated by locating the first heating device 58 at the lower position to allow the first heater 58a in a heating state to approach the processing surface of the substrate W.

Thereafter, the metal (wiring) is also buried in the trench 12. The metal buried in the trench 12 is physically and electrically connected to the via wiring 24 in the via hole 11. The metal can be buried in the trench 12 by any method. For example, the plated metal can be buried in the trench 12 by a known electroless plating method or electroplating method.

The substrate W in which the metal is buried in the via hole 11 and the trench 12 as described above is transferred from the plating processing unit 30c to a heating processing unit. The substrate W in which the metal is buried in the via hole 11 and the trench 12 may be subjected to a rinse processing, a drying processing and other processings in the plating processing unit 30c before being transferred to the heating processing unit.

Figure 14:
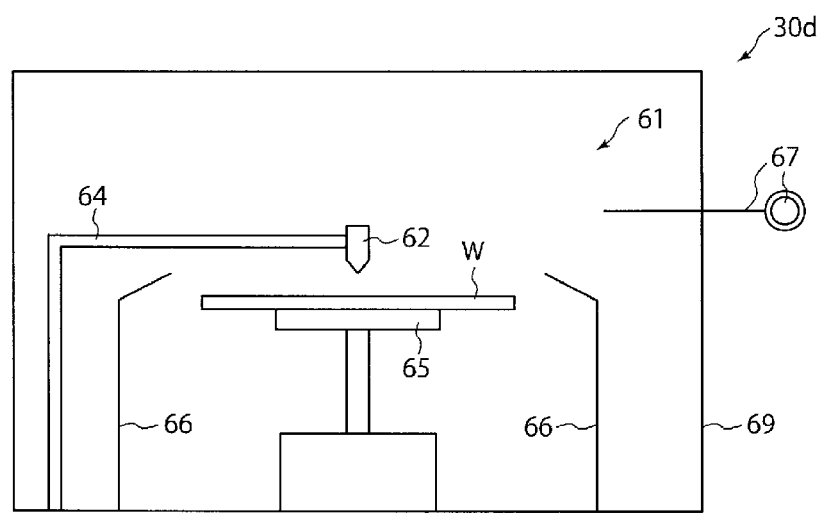
FIG. 14 is a diagram schematically illustrating an example of a removal processing unit including a removal solution supply unit.

FIG. 14 is a diagram schematically illustrating an example of a removal processing unit 30d including a removal solution supply unit 61. A specific configuration of each component of the removal solution supply unit 61 is not limited. Each component of the removal solution supply unit 61 is simply illustrated in FIG. 14.

The removal solution supply unit 61 is configured to supply the removal solution (organic solution or the like) to the substrate W and remove unnecessary solutions (e.g., the above-described solution of the SAM 13 and solution of the intermolecular binder 15) from the substrate W (the via hole 11) together with the removal solution. A composition of the removal solution is appropriately determined depending on the solution to be removed. The illustrated removal solution supply unit 61 includes a fourth discharge member 62 configured to be moved by a fourth discharge driving unit 64, a fourth substrate holder 65, a fourth cup structure 66 and a fourth inert gas supply 67. The fourth discharge member 62, the fourth discharge driving unit 64, the fourth substrate holder 65 and the fourth cup structure 66 are provided inside a fourth processing chamber 69.

The fourth discharge member 62 includes at least a nozzle (not shown) configured to discharge the removal solution. Like the first discharge member 32, the fourth discharge member 62 may be configured to discharge another fluid. Further, a fluid (including the removal solution) discharged from the fourth discharge member 62 is supplied from a non-illustrated fluid source to the fourth discharge member 62 through a flow path provided in the fourth discharge driving unit 64. The fourth substrate holder 65, the fourth cup structure 66, the fourth inert gas supply 67 and the fourth processing chamber 69 have the same configuration and effect as the above-described first substrate holder 35, first cup structure 36, first inert gas supply 37 and first processing chamber 39, respectively.

In the above-described removal processing unit 30d, the unnecessary solutions (e.g., the above-described solution of the SAM 13 and solution of the intermolecular binder 15) are removed from the substrate W. In this case, the removal solution may be supplied to the processing surface of the substrate W while the substrate W is rotated by the fourth substrate holder 65.

A landing position of the liquid discharged from the fourth discharge member 62 on the processing surface of the substrate W is not limited. The fourth discharge member 62 may allow the removal solution to land on the center of the processing surface of the substrate W or to land at a position deviated from the center of the processing surface of the substrate W.

Figure 15:
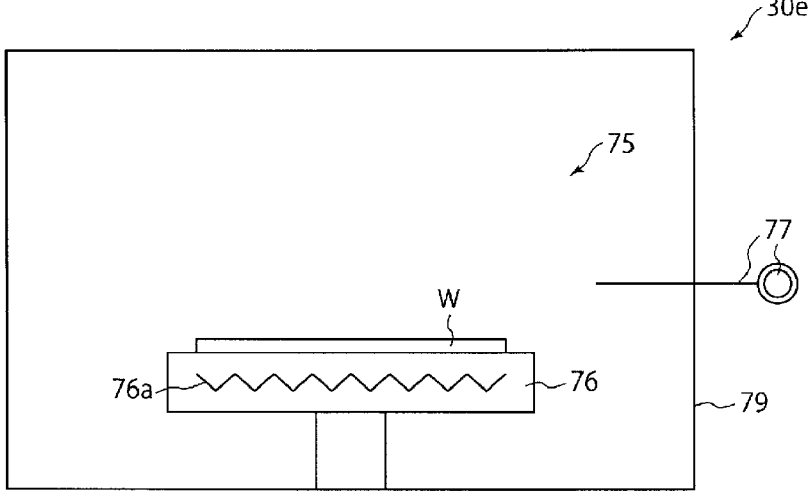
FIG. 15 is a diagram schematically illustrating an example of a heating processing unit including a heating unit.

FIG. 15 is a diagram schematically illustrating an example of a heating processing unit 30e including a heating unit 75. A specific configuration of each component of the heating unit 75 is not limited. Each component of the heating unit 75 is simply illustrated in FIG. 15.

The heating unit 75 is configured to heat the substrate W. The illustrated heating unit 75 includes a second heating device 76 equipped with a second heater 76a and a fifth inert gas supply 77. The second heating device 76 is provided inside a fifth processing chamber 79. The fifth inert gas supply 77 is configured to supply the inert gas into the fifth processing chamber 79. The fifth inert gas supply 77 and the fifth processing chamber 79 have the same configuration and effect as the above-described first inert gas supply 37 and first processing chamber 39, respectively.

In the above-described heating processing unit 30e, the substrate W placed on the second heating device 76 is heated by heat generated from the second heater 76a. The heat amount generated by the second heater 76a is controlled by a control device (see reference numeral "93" in FIG. 16 to be described later), and the substrate W is heated at a desired temperature.

The heating processings (see S3, S5 and S7 in FIG. 6, S12 and S14 in FIG. 7, S22 and S24 in FIG. 8, and S32 in FIG. 9) in the substrate liquid processing method can be performed by the heating processing unit 30e. The heating processing unit 30e may be provided singly or plurally. Each heating processing may be performed by a separate heating processing unit 30e, or two or more heating processings may be performed by a common heating processing unit 30e.

The substrate liquid processing apparatus that executes the above-described substrate liquid processing method includes a unit configured to supply the solution or vapor containing the organic molecules to the substrate W including the via hole 11 and the cap layer 14 exposed at the bottom of the via hole 11, and form the SAM 13 on the side wall of the via hole 11. The unit may include, for example, the SAM processing unit 30a, the heating processing unit 30e and the removal processing unit 30d. In this case, the unit may perform the processing of supplying the solution of the SAM 13 to the substrate W, the processing of heating the SAM 13, and the processing of removing the part of the SAM 13 (see S11 to S14 in FIG. 7).

The substrate liquid processing apparatus also includes a unit configured to attach the intermolecular binder 15, which can be bonded to both the plated metal and the SAM 13, to the SAM 13. The unit may include, for example, the intermolecular binder processing unit 30b, the heating processing unit 30e and the removal processing unit 30d. In this case, the unit may perform the processing of supplying the solution of the intermolecular binder 15 to the substrate W, the processing of heating the intermolecular binder 15, and the processing of removing the part of the intermolecular binder 15 (see S21 to S24 in FIG. 8 and S31 to S33 in FIG. 9).

In addition, the substrate liquid processing apparatus includes a unit configured to supply the electroless plating solution 20 to the via hole 11 in the state where the intermolecular binder 15 is attached to the SAM 13 to precipitate the metal in the via hole 11 and bury the metal in the via hole 11 while bringing the metal into close contact with the intermolecular binder 15. The unit may include, for example, the plating processing unit 30c and the heating processing unit 30e. In this case, the unit may perform the processing of supplying the electroless plating solution 20 to the substrate W and the process of heating the plated metal (see S6 and S7 in FIG. 6).

In the substrate liquid processing apparatus, each of the SAM processing unit 30a, the intermolecular binder processing unit 30b, the plating processing unit 30c, the heating processing unit 30e and the removal processing unit 30d may be provided singly or plurally. Also, the SAM processing unit 30a, the intermolecular binder processing unit 30b, the plating processing unit 30c, the heating processing unit 30e and the removal processing unit 30d can be provided in a single processing system.

Figure 16:
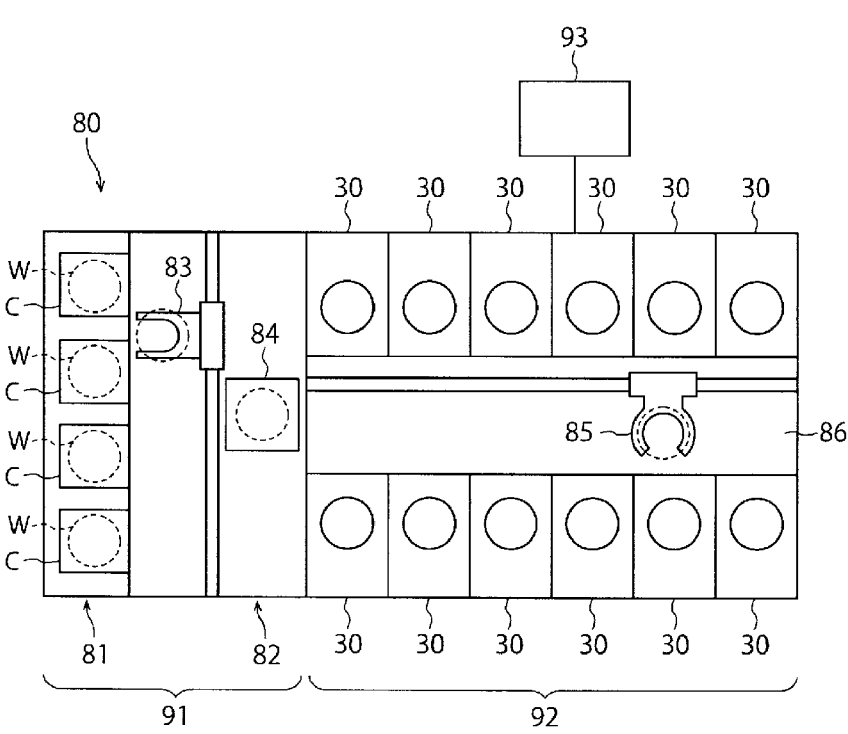
FIG. 16 is a diagram schematically illustrating an example of a processing system.

FIG. 16 is a diagram schematically illustrating an example of a processing system (substrate liquid processing apparatus) 80.

The processing system 80 illustrated in FIG. 16 is equipped with a carry-in/out station 91 and a processing station 92. The carry-in/out station 91 includes a placing section 81 equipped with a plurality of carriers C, and a transfer section 82 equipped with a first transfer mechanism 83 and a delivery unit 84. A plurality of substrates W is horizontally accommodated in each carrier C. The processing station 92 is equipped with a plurality of processing units 30 provided on both sides of a transfer path 86; and a second transfer mechanism 85 configured to be moved back and forth along the transfer path 86.

At least some of the plurality of processing units 30 provided in the processing station 92 are configured to perform the series of processings described above. That is, the SAM processing unit 30a, the intermolecular binder processing unit 30b, the plating processing unit 30c, the removal processing unit 30d and the heating processing unit 30e (see FIG. 11 to FIG. 15) are configured as the processing units 30 illustrated in FIG. 16.

A substrate W is taken out from the carrier C and carried into the delivery unit 84 by the first transfer mechanism 83, and then taken out from the delivery unit 84 by the second transfer mechanism 85. Then, the substrate W is carried into a plurality of processing units 30 corresponding to the series of processings described above by the second transfer mechanism 85, subjected to a preset processing in each corresponding processing unit 30, and then taken out from each corresponding processing unit 10. The substrate W subjected to the series of processings is carried into the delivery unit 84 by the second transfer mechanism 85, and then, returned back into the carrier C of the placing section 81 by the first transfer mechanism 83.

The processing system 80 is equipped with the control device 93. The control device 93 is implemented by, for example, a computer, and is equipped with a controller and a storage. Programs and data for various processings performed in the processing system 80 are stored in the storage of the control device 93. The controller of the control device 93 controls various kinds of devices of the processing system 80 to perform various processings by reading out and executing the programs stored in the storage appropriately. Accordingly, the control device 93 controls various devices provided in the SAM processing unit 30a, the intermolecular binder processing unit 30b, the plating processing unit 30c, the removal processing unit 30d and the heating processing unit 30e, the first transfer mechanism 83 and the second transfer mechanism 85.

The programs and the data stored in the storage of the control device 93 may be recorded in a computer-readable recording medium and may be installed from this recording medium to the storage. The computer-readable recording medium may be, for example, a hard disk (HD), a flexible disk (FD), a compact disk (CD), a magnet optical disk (MO) and a memory card.

Modification Example

In the above-described device (see FIG. 11 to FIG. 16), the processing of supplying the solution of the SAM 13, the processing of supplying the solution of the intermolecular binder 15, the processing of supplying the electroless plating solution 20, the hating processing of the substrate W, and the processing of removing the solutions from the substrate W are performed by different processing units 30, respectively.

However, some or all of the processings may also be performed by a common processing unit 30 (i.e., inside the same processing chamber).

In the above-described apparatus and method, the SAM 13 is formed from the organic solution. However, the SAM 13 may be formed from vapor containing constituent molecules of the SAM 13 by using a device (not shown) such as a vacuum oven. Likewise, the intermolecular binder 15 may be formed from vapor containing constituent molecules of the intermolecular binder 15 by using a device such as a vacuum oven. If the SAM 13 is formed from the vapor, the processing of removing the part of the SAM 13 (see S13 in FIG. 7) may be unnecessary. Likewise, if the intermolecular binder 15 is formed from the vapor, the processing of removing the part of the intermolecular binder 15 (see S23 in FIG. 8 and S33 in FIG. 9) may be unnecessary.

Also, in the examples shown in FIG. 1 to FIG. 5, the cap layer 14 is provided at the bottom of the via hole 11. However, the cap layer 14 may not be provided. In this case, a wiring serving as the catalyst nucleus of the plated metal to be precipitated in the via hole 11 is exposed at the bottom of the via hole 11. Thus, the plated metal can be deposited from the bottom of the via hole 11.

It should be noted that the above-described exemplary embodiment and modification example are illustrative in all aspects and are not anyway limiting. The above-described exemplary embodiment and modification example may be omitted, replaced and modified in various ways without departing from the scope and the spirit of claims. For example, the exemplary embodiment and the modification example described above may be combined with each other, or an exemplary embodiment or modification example other than those described in the preset disclosure may be combined with the above-described exemplary embodiment or modification example.

Furthermore, a technical category for embodying the above-described technical concept is not limited. For example, the above-described substrate liquid processing apparatus may be applied to another device. Moreover, the above-described technical concept may be embodied by a computer-executable program for executing one or more sequences (processes) included in the above-described substrate liquid processing method on a computer. Further, the above-described technical concept may be embodied by a computer-readable non-transitory recording medium in which such a computer-executable program is stored.

I claim:

1. A substrate liquid processing method, comprising:
preparing a substrate including a recess and a wiring exposed at a bottom of the recess;
forming a self-assembled monolayer on a side wall of the recess;
attaching an intermolecular binder, which is allowed to be bonded to both a metal and the self-assembled monolayer, to the self-assembled monolayer;
burying, by supplying an electroless plating solution to the recess in a state where the intermolecular binder is attached to the self-assembled monolayer to precipitate the metal in the recess, the metal in the recess while bringing the metal into contact with the intermolecular binder;
heating the self-assembled monolayer on the side wall of the recess at a first temperature before attaching the intermolecular binder to the self-assembled monolayer;
removing a part of the self-assembled monolayer from the side wall of the recess after heating the self-assembled monolayer at the first temperature and before attaching the intermolecular binder to the self-assembled monolayer; and heating the self-assembled monolayer on the side wall of the recess at a second temperature, which is higher than the first temperature, after removing the part of the self-assembled monolayer from the side wall of the recess and before attaching the intermolecular binder to the self-assembled monolayer, wherein the first temperature promotes bonding between the side wall of the recess and the self-assembled monolayer while suppressing completion of a curing reaction throughout the self-assembled monolayer, and wherein the second temperature increases reactivity of the self-assembled monolayer to the intermolecular binder while suppressing completion of a curing reaction throughout the self-assembled monolayer.

2. The substrate liquid processing method of claim 1, wherein the self-assembled monolayer is formed on the side wall of the recess that is formed of a silicon-containing material.

3. The substrate liquid processing method of claim 1, wherein the self-assembled monolayer contains an organic compound having a silanol group.

4. The substrate liquid processing method of claim 1, wherein the intermolecular binder contains an organic compound having at least one of an amino group or a thiol group.

5. The substrate liquid processing method of claim 1, further comprising:

heating the intermolecular binder attached to the self-assembled monolayer before supplying the electroless plating solution to the recess.

6. The substrate liquid processing method of claim 1, further comprising:

heating the intermolecular binder attached to the self-assembled monolayer at a third temperature before supplying the electroless plating solution to the recess;

removing a part of the intermolecular binder from the self-assembled monolayer after heating the intermolecular binder at the third temperature and before supplying the electroless plating solution to the recess; and heating the intermolecular binder at a fourth temperature, which is higher than the third temperature, after removing the part of the intermolecular binder from the self-assembled monolayer and before supplying the electroless plating solution to the recess.

* * * * *